(12) United States Patent
Debuisschert et al.

(10) Patent No.: US 11,415,609 B2
(45) Date of Patent: Aug. 16, 2022

(54) DEVICE AND METHOD FOR FREQUENCY ANALYSIS OF A SIGNAL

(71) Applicant: THALES, Courbevoie (FR)

(72) Inventors: Thierry Debuisschert, Palaiseau (FR); Ludovic Mayer, Palaiseau (FR)

(73) Assignee: THALES, Courbevoie (FR)

( * ) Notice: Subject to any disclaimer, the term of this patent is extended or adjusted under 35 U.S.C. 154(b) by 109 days.

(21) Appl. No.: 16/969,334

(22) PCT Filed: Feb. 14, 2019

(86) PCT No.: PCT/EP2019/053680
§ 371 (c)(1),
(2) Date: Aug. 12, 2020

(87) PCT Pub. No.: WO2019/158646
PCT Pub. Date: Aug. 22, 2019

(65) Prior Publication Data
US 2021/0048463 A1 Feb. 18, 2021

(30) Foreign Application Priority Data

Feb. 16, 2018 (FR) ...................................... 18 00147

(51) Int. Cl.
*G01R 23/163* (2006.01)
*G01R 23/17* (2006.01)
*G01R 1/00* (2006.01)

(52) U.S. Cl.
CPC .......... *G01R 23/163* (2013.01); *G01R 23/17* (2013.01); *G01R 1/00* (2013.01)

(58) Field of Classification Search
CPC ......... C30B 1/00; C30B 29/04; C30B 29/403; G01R 1/00
See application file for complete search history.

(56) References Cited

U.S. PATENT DOCUMENTS

| 10,274,551 | B2* | 4/2019 | Hruby | ................... G01R 33/26 |
| 2010/0301216 | A1* | 12/2010 | Vardi | ............. H01L 31/035218 |
| | | | | 257/E31.073 |

(Continued)

FOREIGN PATENT DOCUMENTS

| FR | 3 027 681 A1 | 4/2016 |
| WO | WO 2017/062735 A1 | 4/2017 |

OTHER PUBLICATIONS

Chipaux, M et al.,"Wide bandwidth instantaneous radio frequency spectrum analyzer based on nitrogen vacancy centers in diamond", Applied Physics Letters, AIP Publishing LLC, US, vol. 107, No. 23, pp. 233502-1-233502-5 , XP012203138, ISSN: 0003-6951, DOI:10.1063/1.4936758, (2015).

(Continued)

*Primary Examiner* — Jermele M Hollington
*Assistant Examiner* — Temilade S Rhodes-Vivour
(74) *Attorney, Agent, or Firm* — ArentFox Schiff LLP

(57) ABSTRACT

The invention relates to a device for the frequency analysis of a signal, comprising a diamond crystal having NV centers defining sub-regions, an excitation unit for optically or electrically exciting each sub-region, an injection unit for injecting a signal so that the sub-region is in the presence of the signal, a magnetic field generator designed so as to generate a magnetic field on each sub-region, the magnetic field having a spatial variation of amplitude in a first direction, and a detector for detecting the resonance frequency of each sub-region of the region, the detector comprising an electrical contact for detecting the charges created in a sub-region, and a reading circuit.

10 Claims, 1 Drawing Sheet

(56) References Cited

U.S. PATENT DOCUMENTS

Figure 1:
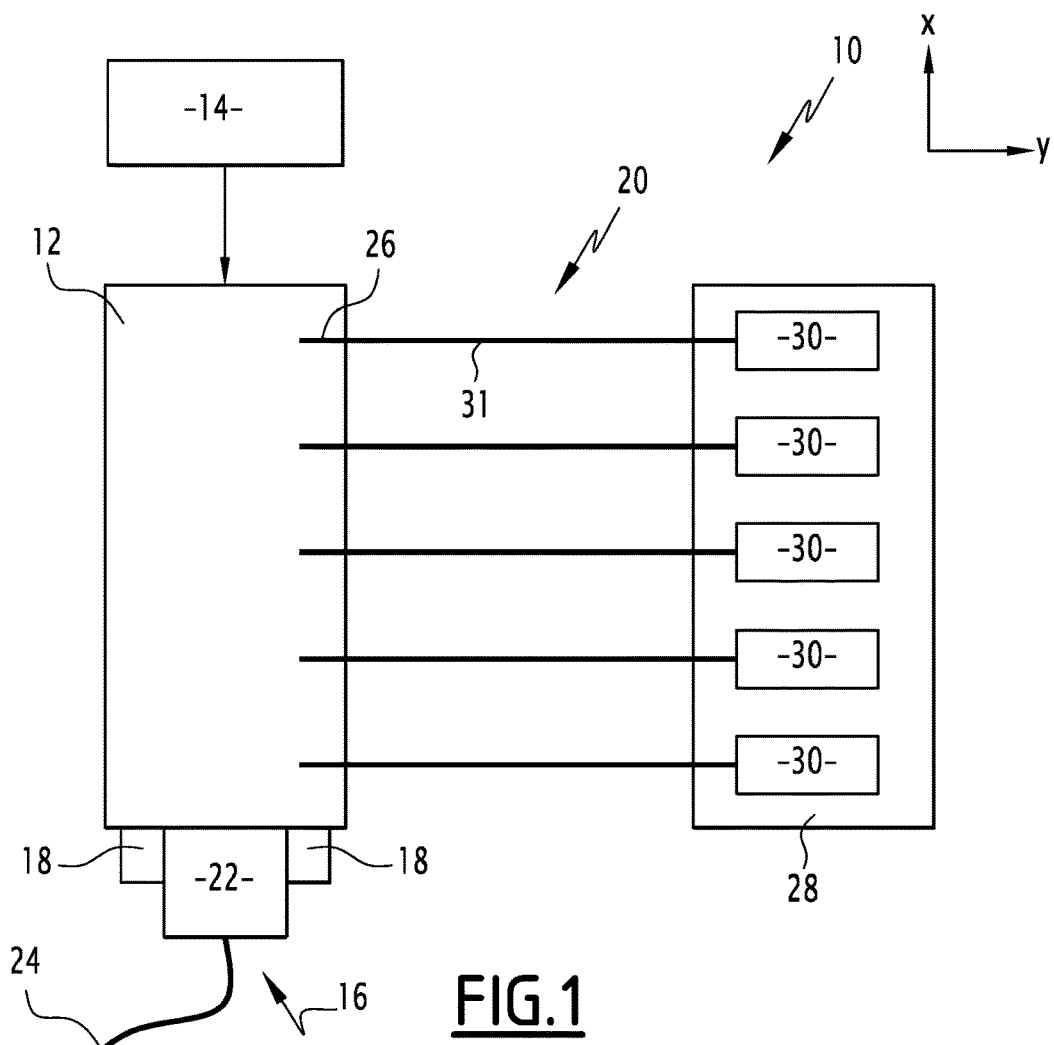

2010/0321117 A1\* 12/2010 Gan ..................... H03B 17/00
                                                                               331/3
2011/0050214 A1\* 3/2011 Bahreyni ........... G01R 33/0283
                                                                               324/244
2018/0238989 A1\* 8/2018 Manickam ............. G01R 33/26
2018/0284026 A1\* 10/2018 Shao ........................ G01R 1/06

OTHER PUBLICATIONS

French Search Report, from the French Patent Office in counterpart French Application No. 1800147, dated Oct. 23, 2018.
International Search Report, issued by International Searching Authority in corresponding International Application No. PCT/EP2019/053680, dated Mar. 29, 2019.

\* cited by examiner

DEVICE AND METHOD FOR FREQUENCY ANALYSIS OF A SIGNAL

CROSS-REFERENCE TO RELATED APPLICATIONS

This application is a National Stage Entry of International Patent Application No. PCT/EP2019/053680, filed on Feb. 14, 2019, which claims priority to French Application No. 18 00147, filed on Feb. 16, 2018. The disclosures of the priority applications are incorporated in their entirety herein by reference.

The present invention relates to a device for frequency analysis of a signal. The present invention also relates to a corresponding method for frequency analysis of a signal.

The present invention relates to the field of the frequency analysis of a signal, that is to say the identification of the frequency of the frequency components of an unknown signal as well as the determination of the amplitudes of the frequency components. More specifically, the domain in question is the microwave frequency domain. A signal whose frequency is typically inclusively between several megahertz (MHz) and several hundred gigahertz (GHz) is considered to be a microwave frequency signal.

The spectrum analysis of the microwave frequency signals is done either in an analog manner, or digitally.

In an analog manner, the frequency of a local oscillator is varied, which is heterodyned with the signal to be measured. The frequency scanning prevents having an instantaneous acquisition of the entire spectrum.

It is possible to measure the entire wanted spectrum instantaneously with solid-state techniques such as the SHB (Spectral Hole Burning) technique, but one limitation of this technique is the need to use a crystal cooled to a cryogenic temperature.

In the digital case, an entering signal is digitized using an analog-digital converter, then a fast Fourier transform (FFT) is applied on the digitized signal.

However, such a technique is limited by the dynamic of the converters operating at a high frequency.

There is therefore a need for a device for analyzing a microwave frequency signal that has an improved performance.

To that end, the description proposes a device for the frequency analysis of a signal, comprising a diamond crystal having a crystal lattice, a valence band and a conduction band, the crystal comprising NV centers in the crystal lattice, each NV center being made up of a nitrogen atom substituted for a carbon atom and coupled to a vacancy, the nitrogen atom and hole pair making up a colored center in the crystal lattice, the diamond crystal having at least one region including several sub-regions each having a resonance frequency between the energy levels of the $NV^-$ center in which, for each of the sub-regions, when the sub-region is in the presence of an optical or electric excitation, charges are generated in the conduction band, and, in the presence of a signal having at least one frequency equal to the resonance frequency of the sub-regions, the quantity of charges varies with the amplitude of the frequency component of the signal at the resonance frequency. The analysis device comprises an excitation unit for optically or electrically exciting each sub-region, an injection unit for injecting a signal so that the sub-region is in the presence of the signal, a magnetic field generator designed so as to generate a magnetic field on each sub-region, the magnetic field having a spatial variation of amplitude in a first direction and a detector. The detector is able to detect the resonance frequency of each sub-region of the region, the detector including an electrical contact for each sub-region whose detector is able to detect the resonance frequency, each electrical contact being able to detect the charges created in the sub-region in question in the conduction band of the crystal in order to obtain a signal when the sub-region is simultaneously in the presence of an optical or electrical excitation coming from the excitation unit and a signal injected by the injection unit, and the detector includes a silicon reading circuit connected to the contacts in order to convert each obtained signal into a converted signal, each converted signal depending on the amplitude of the frequency component at the resonance frequency of the sub-region.

According to specific embodiments, the device comprises one or more of the following features, considered alone or according to any technically possible combinations:
    the distance between two contacts is less than 300 nanometers.
    the reading circuit is a CMOS circuit.
    the reading circuit includes a plurality of processing units, each processing unit being connected to a respective contact.
    each processing unit is connected to a respective contact by an indium pad or by a wire.
    the detector further includes a printed circuit board, the printed circuit board connecting the reading circuit to the contacts.
    each contact is formed by two electrodes interdigitated in a second direction, the second direction being perpendicular to the first direction.
    the crystal is a layer extending primarily along a plane and having an axis 111, the axis 111 belonging to the plane.
    the number of contacts is greater than 500.

The present disclosure also relates to a method for the frequency analysis of a signal, the method including a step for providing a diamond crystal having a crystal lattice, a valence band and a conduction band, the crystal comprising NV centers in the crystal lattice, each NV center being made up of a nitrogen atom substituted for a carbon atom and coupled to a vacancy, the nitrogen atom and vacancy pair making up a colored center in the crystal lattice, the crystal having at least one region including several sub-regions each having a resonance frequency between the energy levels of the $NV^-$ center in which, for each of the sub-regions, when the sub-region is simultaneously in the presence of an optical or electric excitation and a signal having at least one frequency equal to the resonance frequency of the subregion, a change in the quantity of charges generated in the conduction band appears. The method also including a step for optical or electrical excitation of each sub-region of the diamond crystal, injecting a signal so that the sub-region is in the presence of the signal, generating a magnetic field on each sub-region, the magnetic field having a spatial variation of amplitude in a first direction, and detecting the resonance frequency of each sub-region of the region by detecting the charges created in each sub-region in the conduction band of the diamond using an electrical contact specific to each sub-region, in order to obtain a signal and by converting each obtained signal into a converted signal with a silicon reading circuit connected to the contacts, each converted signal depending on the frequency component of the signal at the resonance frequency of the sub-region.

Figure 2:
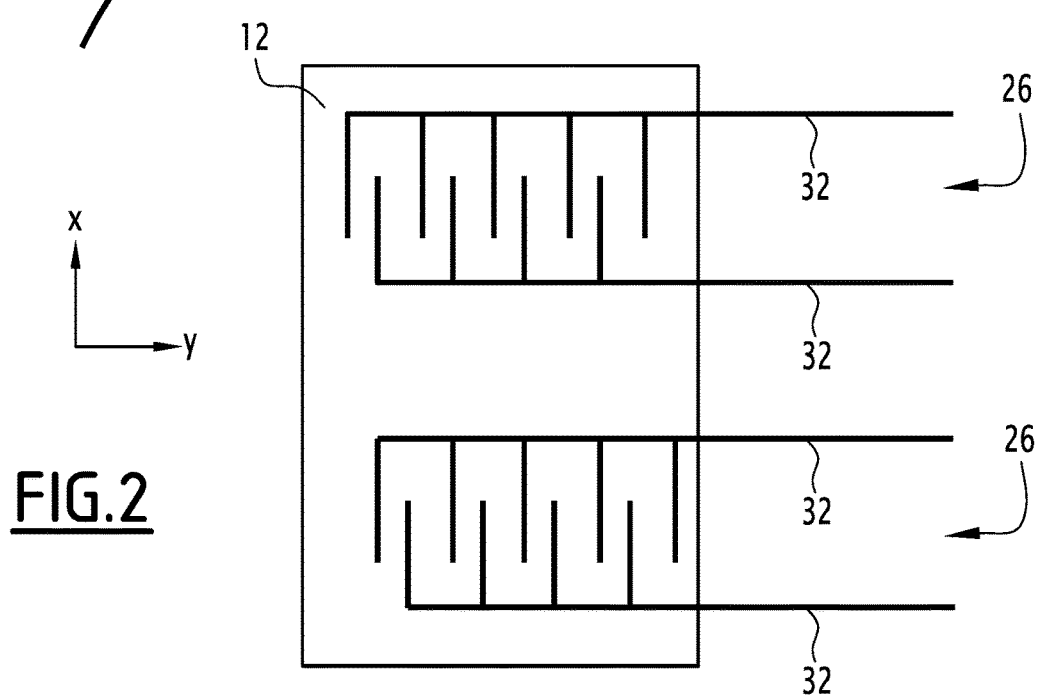

Other features and advantages of the invention will appear upon reading the following description of embodiments of the invention, provided as an example only and in reference to the drawings, which are:

FIG. 1, a schematic view of an exemplary device for analyzing a microwave frequency signal, FIG. 2, a schematic view of another exemplary device for analyzing a microwave frequency signal.

An analysis device 10 is illustrated schematically in FIG. 1.

The analysis device 10 is able to analyze a signal.

In the context of the invention, the term "analyze" refers to one of the following actions: identifying the frequency of frequency components of a signal and determining the amplitude of frequency components of a signal.

The analysis device 10 is thus suitable for identifying the frequency of frequency components of a signal and suitable for determining the amplitudes of frequency components of a signal.

The analysis device 10 is thus a spectrum analyzer.

In the described example, the analysis device 10 is a device for analyzing a microwave frequency signal, a microwave frequency signal having a frequency inclusively of between 1 MHz and several 100 GHz.

The device 10 includes a diamond crystal 12, an excitation unit 14, a unit for injecting the signal to be analyzed 16, a magnetic field generator 18 and a detector 20 formed by contacts 26 and a reading circuit 28 including a set of processing units 30.

The diamond crystal 12 has a crystal lattice. The energy levels are characterized by a valence band and a conduction band.

The crystal 12 comprises NV centers in the crystal lattice.

The NV centers are present near the surface or in the volume.

Each NV center is made up of a nitrogen atom substituted for a carbon atom and coupled to a vacancy, the nitrogen atom and vacancy pair making up a colored center in the crystal lattice.

More specifically, an NV center is a periodic defect in the crystal lattice of the diamond, formed by a nitrogen atom (N) substituted for a carbon atom and to which a vacancy is coupled in an adjacent site of the crystal lattice (V for "vacancy").

The occurrence of NV centers in the diamond is well controlled. Large diamonds are produced by a CVD (Chemical Vapor Deposition) method typically in the form of parallelepipeds measuring several millimeters per side and several hundred micrometers thick. The NV centers can be created by ion implantation of nitrogen atoms. The NV centers can also be created by incorporating nitrogen in a controlled manner during the growth of the diamond using the "in situ doping" method. At the end, the diamond is annealed (800° C.) so that the vacancies combine with the nitrogen impurities to form the NV centers. The NV centers are created in volume or in uniform layers near the surface.

The nitrogen plus vacancy assembly forming the NV center thus constitutes an "artificial atom", incorporated within the diamond matrix and detectable on an individual scale. An NV$^-$ center has a very precise location that does not vary over time.

The NV center can exist with several different charge states. The state used in the described example is the NV$^-$ center, which has captured an additional electron relative to its neutral state. The NV$^-$ center has an electron spin resonance corresponding to the transitions between the level $m_s=0$ and the levels $m_s=-1$ and $m_s=+1$ of the fundamental $^3A_2$ and excited $^3E$ levels. In the absence of a magnetic field, the levels $m_s=-1$ and $m_s=+1$ are degenerated. The application of an outside magnetic field results in a lifting of degeneration by Zeeman effect between the levels of spin $m_s=-1$ and $m_s=1$, both for the fundamental level $^3A_2$ and the excited level $^3E$. The Zeeman effect results in coupling between the outside magnetic field and the magnetic moment of the electrons driving the lifting of degeneration. The diamond crystal 12 has at least one region including several sub-regions each having a resonance frequency between the energy levels of the NV center in which, for each of the sub-regions, when the sub-region is in the presence of an optical or electric excitation, charges are generated in the conduction band. In the presence of a microwave frequency signal having at least one frequency equal to the resonance frequency of the sub-region, the quantity of charges transferred in the conduction band is modified.

Advantageously, the crystal 12 has a planar geometry, the plane including two directions indicated by the axes X and Y in FIG. 1. Hereinafter, the first direction is called first direction X and the second direction is called second direction Y.

The excitation unit 14 is able to excite each sub-region.

More specifically, the excitation unit 14 is able to excite the NV centers contained in the sub-regions.

According to the embodiment of FIG. 1, the excitation unit 14 is able to excite each sub-region with an optical excitation.

The excitation unit 14 is a laser diode.

The laser diode is able to emit in the visible domain, in particular in a wavelength band inclusively between 400 nanometers (nm) and 650 nm.

The laser diode is in contact with the crystal 12.

More generally, the excitation unit 14 is a light source, in particular a pump laser, such as a laser diode.

The injection unit 16 is able to inject a signal to be analyzed so that each sub-region is in the presence of the signal to be analyzed.

According to the described embodiment, the injection unit 16 is a transmitting antenna 22 and a cable 24.

The transmitting antenna 22 is placed near the crystal 12 and emits the signal to be analyzed.

The transmitting antenna 22 for example comprises a loop ensuring that a uniform field is obtained at the crystal 12.

The cable 24 is a coaxial cable.

The signal to be analyzed comes from the coaxial cable 24, in which the signal circulates.

According to one particular embodiment, the cable 24 is connected to a receiving antenna so as to better capture the signal.

The magnetic field generator 18 is designed so as to generate a magnetic field on each sub-region, the magnetic field having a spatial variation of amplitude in the first direction X.

Advantageously, the spatial variation of amplitude of the magnetic field is monotonic.

According to one embodiment, the spatial variation is a linear variation.

For example, the magnetic field generator 18 is able to apply a field gradient of several hundred T/m.

According to one particular case, the magnetic field generator 18 is a neodymium magnet.

As previously indicated, the detector 20 includes contacts 26 and a reading circuit 28.

The detector 20 is able to detect the resonance frequency of each sub-region of the region.

More specifically, the detector 20 includes an electrical contact 26 for each sub-region whereof the detector 20 is able to detect the resonance frequency.

Each electrical contact 26 is able to detect the charges created in the sub-region in question in the conduction band of the diamond in order to obtain a signal when the sub-region is simultaneously in the presence of an optical or electrical excitation coming from the excitation unit 14 and a signal injected by the injection unit 16.

Due to this charge collection role, the electrical contact 26 can also be referred to as electrode.

Furthermore, it should be noted that each contact 26 can include a plurality of points of contact with the crystal (see in particular FIG. 2, described later).

The number of contacts 26 determines the frequency resolution of the detector 20.

According to the described example, the metal contacts 26 are gold tracks with a catch on the crystal 12 made from tungsten.

The contacts 26 are deposited on the diamond crystal 12, for example by a lithography technique.

The distance between two contacts 26 is denoted $d_{contact}$.

The distance between two contacts 26 is defined as the minimum distance between two points of the contacts 26.

Advantageously, the distance between two contacts 26 is the same for all of the contents 26.

According to the described example, the distance $d_{contact}$ between two contacts 26 is inclusively between 10 nanometers (nm) and 50 micrometers (μm).

The distance $d_{contact}$ between two contacts 26 and the desired resolution makes it possible to deduce the size of the crystal 12 therefrom. Typically, a distance $d_{contact}$ between two contacts 26 of 1.0 μm and a frequency resolution of $\frac{1}{1000}^{th}$ of the width of the spectral band of the signal to be analyzed leads to a crystal 12 length of 1 mm.

Each charge collected by a contact 26 forms an obtained signal.

The reading circuit 28 is able to convert each signal obtained by the contacts 26 into a converted signal, each converted signal is specific to the resonance frequency of the sub-region and is a function of the amplitude of the corresponding frequency component. This function is made up of a constant part connected to the background signal produced by the NV center and a part proportional to the amplitude of the measured frequency component and which is subtracted from the background. In order to have a signal that is directly proportional to the amplitude of the measured frequency component, it is therefore necessary to process the signal in order to subtract the background therefrom.

In other words, the reading circuit 28 is a processing part able to process each analog electrical signal coming from a plurality of detectors. The processing for example includes an amplification or a digitization. The processing part comprises a specific processing unit 30 for each detector.

The spacing between the processing units 30 is called "pitch" hereinafter.

The reading circuit 28 is made from silicon.

For example, the reading circuit 28 is a CMOS (Complementary Metal Oxide Semiconductor) circuit.

In a variant, the reading circuit 28 is a charge-coupled device (CCD).

As an example, the reading circuit 28 is a transimpedance amplifier making it possible to read the current in a charge resistance or a charge amplifier making it possible to read the charge of a capacitance. Such a reading circuit 28 is known for operating with low noise and being suitable for detecting low charges.

The reading circuit 28 is connected to the contacts 26 in order to convert each obtained signal into a converted signal, each converted signal depending on the amplitude of the frequency component corresponding to the resonance frequency of the sub-region.

This means that each contact 26 is connected to a respective processing unit 30 of the reading circuit 28.

For example, each processing unit 30 is connected by a wire 31 to a respective contact 26.

In a variant, each processing unit 30 is connected by an indium pad to a respective contact 26.

In this variant, the pitch is equal to the distance $d_{contact}$ between the contacts 26.

According to another embodiment, the detector 20 further includes a printed circuit board (PCB).

The printed circuit connects the reading circuit 28 to the contacts 26.

More specifically, the printed circuit board includes conductive tracks, each contact 26 being connected to a respective processing unit 30 via a conductive track.

The operation of the analysis device 10 is now described in reference to one example embodiment of a method for analyzing a signal.

The method includes an excitation step, an injection step, a generating step and a detection step, these steps being implemented simultaneously.

During the excitation step, the excitation unit 14 optically excites each sub-region of the diamond crystal 12.

The electrons of the NV centers are thus optically pumped in the conduction band.

During the injection step, the injection unit 16 injects a signal to be analyzed so that each sub-region is in the presence of the signal.

During the generating step, the magnetic field generator 18 generates a magnetic field on each sub-region.

The magnetic field modifies the resonance frequency in each sub-region by Zeeman effect.

The excitation, injection and generating steps are implemented simultaneously so that each sub-region is simultaneously in the presence of the optical excitation, an injected signal and the magnetic field.

When the sub-region is simultaneously in the presence of an optical excitation and a signal having at least one frequency equal to the resonance frequency of the sub-region, a change occurs in the number of charges generated in the conduction band, which allows the detection of the signal.

During the detection step, the amplitude of the frequency component is detected at the resonance frequency of each sub-region. Thus, the detection step is a photoelectric detection of the spin state of the electrons of the NV centers of the diamond crystal 12.

To that end, each contact 26 collects the charges generated in the conduction band by the NV centers. A signal is thus obtained for each contact 26.

The signal is conducted or transferred toward the processing unit 30 to which the contact 26 is connected.

Each signal is then converted by the processing unit 30.

The converted signal depends on the frequency component at the resonance frequency of the sub-region.

The analysis method thus makes it possible to analyze a signal of interest by using NV centers of the diamond and an electrical detection of the magnetic resonance signal using the photoelectric effect (also referred to using the acronym PDMR).

Relative to an optical detection of the magnetic resonance (also designated using the acronym ODMR), the device 10 is a more compact device 10, since no optical reading unit, in particular a microscope, is involved.

According to one particular embodiment, the distance $d_{contact}$ between two contacts 26 is smaller than 300 nm, which makes it possible to obtain a better resolution than an optical detection. Indeed, such a distance is smaller than the optical resolution limit.

The analysis device 10 makes it possible to perform an instantaneous detection of the entire signal to be analyzed. The device 10 is therefore faster than a conventional scanning system. Furthermore, due to its simplicity, the device 10 is less expensive and more compact.

The analysis device 10 is thus a solid-state device, compact and operating at ambient temperature.

Another embodiment of the analysis device 10 is proposed in reference to FIG. 2.

The analysis device 10 in this case is similar to the analysis device 10 of FIG. 1. The identical elements are not repeated hereinafter. Only the differences are highlighted.

In such a case, each contact 26 is formed by two interdigitated electrodes 32.

Interdigitated electrodes 32 are a pair of networks in comb form, each tooth of the comb being an electrode. The pairs of networks are interleaved in one another, such that between two electrodes of the first network is an electrode of the second network.

Like before, each pair of networks is connected to a single processing unit 30 of the reading circuit 28.

Furthermore, it should be noted that the midpoint is defined as the electrode of the middle of the network of interdigitated electrodes 32.

In the described example, a direction can be defined for each interdigitated electrode 32, the directions being parallel.

Furthermore, the directions are along the second direction Y, which is perpendicular to the application direction of the magnetic field gradient.

The operation of the analysis device 10 according to FIG. 2 is similar to that of the device 10 of FIG. 1 except in that the use of such interdigitated electrodes 32 further makes it possible to apply an additional excitation field. The excitation field amplitude corresponds to several volts.

The device 10 according to FIG. 2 has the same advantages as the device 10 according to FIG. 1.

Furthermore, because the electrodes are interdigitated along the second direction Y, the space requirement is reduced and the collection efficiency of the charges is improved, which results in an improvement of the signal-to-noise ratio of the device 10.

Typically, an increase by a factor of 50 of the detected signal is expected.

Other embodiments are conceivable to improve the collection of the wanted signal.

In particular, any embodiment tending to align the axis of the NV centers, the first direction X and the propagation direction of the optical or electrical excitation is favorable for the collection of the wanted signal.

For example, to that end, a diamond crystal 12 is a layer having an axis 111 along which the NV centers are aligned, the axis 111 belonging to the plane in which the diamond crystal 12 primarily extends.

If such a crystal 12 is not present, it is possible to start from a commercial crystal 12 having facets 110 and a typical thickness of 500 μm. By shaping it appropriately, a crystal 12 is obtained of the order of 500 μm long with the correct orientation.

It is also possible to use a crystal 12 whereof the NV centers are all oriented along a single axis 111, which can be obtained by monitoring the growth. If the crystalline quality is not sufficient, a crystal 12 is also used whose growth is done along 113 during the growth in order to benefit from the preferred orientation of the NV centers and to subsequently shape along the direction 111.

Advantageously, the magnetic field generator 18 is configured so that the amplitude of the magnetic field is constant along a perpendicular direction Z perpendicular to the plane of the crystal 12 as well as for the second direction Y in the plane of the crystal 12. This feature is obtained for long magnets in the perpendicular direction Z and the second direction Y, which requires the invariance of the magnetic field in these directions. This allows all of the NV centers located along the perpendicular direction Z and the second direction Y and having the same coordinate along the first direction X to have the same resonance frequency. It is therefore possible to add all of their contributions together in order to form the collection signal, which makes it possible to increase the detected signal and to improve the signal-to-noise ratio.

The invention claimed is:

1. A device for frequency analysis of a signal, comprising:
a diamond crystal having a crystal lattice, a valence band and a conduction band, the crystal comprising NV centers in the crystal lattice, each NV center being made up of a nitrogen atom substituted for a carbon atom and coupled to a vacancy, the nitrogen atom and vacancy pair making up a colored center in the crystal lattice, the diamond crystal having at least one region including several sub-regions each having a resonance frequency between the energy levels of the NV$^-$ center in which, for each of the sub-regions, when the sub-region is in the presence of an optical or electric excitation, charges are generated in the conduction band, and, in the presence of a signal having at least one frequency equal to the resonance frequency of the sub-regions, the quantity of charges varies with the amplitude of the frequency component of the signal at the resonance frequency,
an excitation unit for optically or electrically exciting each sub-region,
an injection unit for injecting a signal for the sub-region to be in the presence of the signal,
a magnetic field generator configured to generate a magnetic field on each sub-region, the magnetic field having a spatial variation of amplitude in a first direction, and
a detector adapted to detect the resonance frequency of each sub-region of the region, the detector including:
an electrical contact for each sub-region whose detector is adapted to detect the resonance frequency, each electrical contact being able to detect the charges created in the sub-region in question in the conduction band of the crystal in order to obtain a signal when the sub-region is simultaneously in the presence of an optical or electrical excitation coming from the excitation unit and a signal injected by the injection unit, and
a silicon reading circuit connected to the contacts to convert each obtained signal into a converted signal, each converted signal depending on the amplitude of the frequency component at the resonance frequency of the sub-region.

2. The device according to claim 1, wherein the distance between two contacts is less than 300 nanometers.

3. The device according to claim 1, wherein the reading circuit is a CMOS circuit.

4. The device according to claim 1, wherein the reading circuit includes a plurality of processing units, each processing unit being connected to a respective contact.

5. The device according to claim 4, wherein each processing unit is connected to a respective contact by an indium pad or by a wire.

6. The device according to claim 1, wherein the detector further includes a printed circuit board, the printed circuit board connecting the reading circuit to the contacts.

7. The device according to claim 1, wherein each contact is formed by two electrodes interdigitated in a second direction, the second direction being perpendicular to the first direction.

8. The device according to claim 1, wherein the crystal is a layer extending primarily along a plane and having an axis, the axis belonging to the plane.

9. The device according to claim 1, wherein the number of contacts is greater than 500.

10. A method for the frequency analysis of a signal, the method including at least the following steps:
  providing a diamond crystal having a crystal lattice, a valence band and a conduction band, the crystal comprising NV centers in the crystal lattice, each NV center being made up of a nitrogen atom substituted for a carbon atom and coupled to a vacancy, the nitrogen atom and vacancy pair making up a colored center in the crystal lattice, the crystal having at least one region including several sub-regions each having a resonance frequency between the energy levels of the $NV^-$ center in which, for each of the sub-regions, when the sub-region is simultaneously in the presence of an optical or electric excitation and a signal having at least one frequency equal to the resonance frequency of the subregion, a change in the quantity of charges generated in the conduction band appears;
  optically or electrically exciting each sub-region of the diamond crystal,
  injecting a signal so that the sub-region is in the presence of the signal,
  generating a magnetic field on each sub-region, the magnetic field having a spatial variation of amplitude in a first direction, and
  detecting the resonance frequency of each sub-region of the region by:
    detecting the charges created in each sub-region in the conduction band of the diamond using an electrical contact specific to each sub-region, in order to obtain a signal and
    converting each obtained signal into a converted signal with a silicon reading circuit connected to the contacts, each converted signal depending on the frequency component of the signal at the resonance frequency of the sub-region.

* * * * *